(12) United States Patent
Fukuzawa

(10) Patent No.: US 9,712,111 B2
(45) Date of Patent: Jul. 18, 2017

(54) OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/014,283

(22) Filed: Feb. 3, 2016

(65) Prior Publication Data

US 2016/0226447 A1    Aug. 4, 2016

(30) Foreign Application Priority Data

Feb. 4, 2015    (JP) .................................. 2015-020200

(51) Int. Cl.
| | | |
|---|---|---|
| H03L 7/085 | (2006.01) | |
| H03L 7/089 | (2006.01) | |
| H03B 5/32 | (2006.01) | |
| H03B 5/12 | (2006.01) | |

(52) U.S. Cl.
CPC ............... *H03B 5/32* (2013.01); *H03B 5/129* (2013.01); *H03B 2200/0062* (2013.01); *H03B 2201/0283* (2013.01); *H03B 2201/038* (2013.01); *H03B 2202/06* (2013.01)

(58) Field of Classification Search
CPC .. H03B 5/129; H03B 5/32; H03B 2200/0062; H03B 2201/038; H03B 2202/06; H03B 2201/0283

USPC .................. 331/1 A, 16, 116 R, 116 FE, 182
See application file for complete search history.

(56) References Cited

U.S. PATENT DOCUMENTS

| | | | | |
|---|---|---|---|---|
| 5,517,148 | A * | 5/1996 | Yin ...................... | H03F 1/0222 326/68 |
| 6,791,425 | B2 * | 9/2004 | Kitamura ............. | H03B 5/1293 331/117 FE |
| 7,795,985 | B2 | 9/2010 | Roithmeier | |
| 8,044,739 | B2 * | 10/2011 | Rangarajan .......... | H03B 5/1265 327/337 |
| 2008/0143452 | A1 * | 6/2008 | Rosik ....................... | H03B 5/06 331/158 |
| 2012/0133416 | A1 * | 5/2012 | Ogawa ............... | H03K 3/35613 327/333 |
| 2013/0043959 | A1 * | 2/2013 | Ishii ..................... | H03H 9/0542 331/158 |

FOREIGN PATENT DOCUMENTS

JP          08-272463 A     10/1996

* cited by examiner

*Primary Examiner* — Richard Tan
(74) *Attorney, Agent, or Firm* — Harness, Dickey & Pierce, P.L.C.

(57) ABSTRACT

An oscillator includes an input terminal, an oscillation circuit section configured to cause a resonator to resonate to output an oscillator signal, a digital input section to which a signal for controlling an oscillation frequency of the oscillation circuit section is input via the input terminal, and a first bias circuit section including a constant current source configured to supply a reference current to the digital input section.

20 Claims, 7 Drawing Sheets

OSCILLATOR, ELECTRONIC APPARATUS, AND MOVING OBJECT

BACKGROUND

1. Technical Field

The present invention relates to an oscillator, an electronic apparatus, and a moving object.

2. Related Art

JP-A-8-272463 (Patent Literature 1) describes a semiconductor integrated circuit (a semiconductor IC (Integrated Circuit)) in which an oscillation circuit and a logic circuit (a digital circuit) are respectively connected to individual voltage regulators and the oscillation circuit and the logic circuit operate at different power supply voltages.

When an oscillator including the semiconductor integrated circuit described in Patent Literature 1 is realized, since an amplitude level of an output signal of the oscillator generated by the logic circuit is determined by a standard (e.g., an amplitude level of approximately 2.8 V), for example, a relatively high power supply voltage of approximately 3.3 V is sometimes necessary as power supply voltages input to the regulators. When the oscillator is configured to be capable of receiving, from the outside, an input of a digital signal for controlling an oscillation frequency, the amplitude of the digital signal is set to 3.3 Vpp and the oscillator determines that, for example, with 1.65 V set as a threshold, the digital signal is at a high level if the digital signal is higher than 1.65 V and is at a low level if the digital signal is lower than 1.65 V.

On the other hand, recent process miniaturization is conspicuous. In a semiconductor integrated circuit manufactured by a fine process, an operating voltage is lower due to limitation of a withstanding voltage of a transistor. Since the semiconductor integrated circuit that controls the oscillator (the semiconductor integrated circuit that outputs the digital signal) has a large circuit size, high integration is necessary. Therefore, the semiconductor integrated circuit often operates at a low voltage such as 0.9 V or 1.2 V. Therefore, the semiconductor integrated circuit that controls the oscillator needs to convert the amplitude of a signal generated on the inside into 3.3 Vpp with a level shift circuit and output the digital signal. Then, power consumption of the semiconductor integrated circuit and the oscillator increases and noise received by the oscillator increases in proportion to a square of the amplitude of the input digital signal. On the other hand, it is also conceivable that, in the oscillator, a power supply voltage of a digital input section, to which the digital signal is input, is set to a fixed power supply voltage adjusted to the amplitude of the digital signal to make the level shift circuit unnecessary in the semiconductor integrated circuit that controls the oscillator. However, in the oscillator, the threshold for determining whether the input signal is high or low is fixed and an allowable range of a high level input is narrow. Therefore, it is difficult to enable connection of all of a plurality of kinds of semiconductor integrated circuits having different amplitudes of output signals. The oscillator is poor in versatility. That is, there has been a demand for an oscillator having a wider allowable range of a high level of a digital signal than in the past in order to satisfy versatility.

SUMMARY

An advantage of some aspects of the invention is to provide an oscillator having a wider allowable range of a high level input of a digital signal than in the past and provide an electronic apparatus and a moving object including the oscillator.

The invention can be implemented as the following forms or application examples.

Application Example 1

An oscillator according to this application example includes: an input terminal; an oscillation circuit section configured to cause a resonator to resonate to output an oscillator signal; a digital input section to which a digital signal for controlling an oscillation frequency of the oscillation circuit section is input via the input terminal; and a first bias circuit section including a constant current source configured to supply a reference current to the digital input section.

With the oscillator according to this application example, the reference current is supplied from the first bias circuit section to the digital input section. Therefore, the digital input section can compare, on the basis of the reference current, a voltage of the digital signal input to the digital input section via the input terminal with a threshold voltage lower than the threshold voltage of the oscillator in the past and determine whether the voltage of the digital signal is at a high level or a low level. Consequently, it is possible to realize the oscillator having a wider allowable range of a high level input of a digital signal than in the past to which a digital signal having amplitude of the same degree as a power supply voltage can be input and a digital signal having amplitude smaller than minimum amplitude allowed in the oscillator in the past can be input.

Application Example 2

The oscillator according to the application example may include a second bias circuit section configured to supply at least one of an electric current and a voltage to the oscillation circuit section.

With the oscillator according to this application example, the first bias circuit section that supplies the reference current to the digital input section and the second bias circuit that supplies at least one of the electric current and the voltage to the oscillation circuit section are separated. Therefore, it is possible to reduce the likelihood that noise occurring in the digital input section is propagated to the oscillation circuit section and the oscillation signal is modulated by the noise.

Application Example 3

In the oscillator according to the application example, the digital input section may include a MOS transistor.

Application Example 4

In the oscillator according to the application example, the digital input section may include a level shift circuit configured to convert a voltage of the digital signal.

Application Example 5

The oscillator according to the application example may include a digital operation section configured to generate, on the basis of an output signal from the digital input section, a signal for controlling the oscillation frequency of the oscillation circuit section.

Application Example 6

The oscillator according to the application example may include a regulator configured to supply electric power to the digital operation section.

According to this application example, it is possible to cause the digital operation section to operate at a voltage lower than the power supply voltage and reduce power consumption.

Application Example 7

An electronic apparatus according to this application example includes the oscillator according to the application example.

Application Example 8

A moving object according to this application example includes the oscillator according to the application example.

According to these application examples, the oscillator having a wider allowable range of a high level input of a digital signal than in the past is used. Therefore, it is possible to suppress an increase in noise by inputting a digital signal having small amplitude to the oscillator and realize the electronic apparatus and the moving object having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention are explained in detail below with reference to the accompanying drawings. Note that the embodiments explained below do not unduly limit contents of the invention described in the appended claims. Not all of components explained below are essential constituent elements of the invention.

1. Oscillator 1-1. First Embodiment

Figure 1:
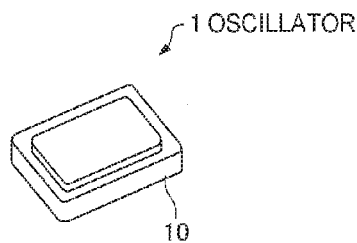
FIG. 1 is a perspective view of an oscillator according to a first embodiment.
Figure 2:
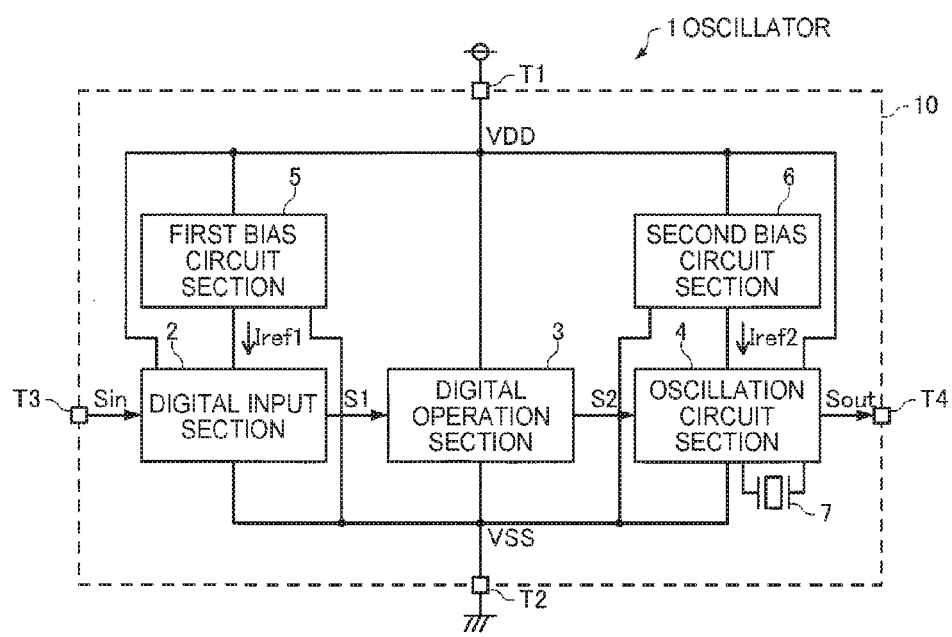
FIG. 2 is a diagram showing the configuration of the oscillator according to the first embodiment.

FIG. 1 is a perspective view of an oscillator according to a first embodiment. FIG. 2 is a diagram showing the configuration of the oscillator according to the first embodiment. An oscillator 1 according to the first embodiment is a digitally controlled oscillator capable of controlling an oscillation frequency according to a digital signal input from an external terminal. The oscillator 1 includes, as shown in FIGS. 1 and 2, a digital input section 2, a digital operation section 3, an oscillation circuit section 4, a first bias circuit section 5, a second bias circuit section 6, and a resonator 7 and a package (a container) 10 in which these components are mounted. The digital input section 2, the digital operation section 3, the oscillation circuit section 4, the first bias circuit section 5, and the second bias circuit section 6 may be configured by one integrated circuit (IC), may be configured to be divided into a plurality of integrated circuits (ICs), or may be partially configured by discrete components. The integrated circuit (IC) is manufactured by, for example, a CMOS process or BiCMOS process. Note that the oscillator 1 according to this embodiment may be configured by omitting or changing a part of the components shown in FIG. 2 or adding other components.

The oscillator 1 operates using, as a power supply voltage, a voltage between a pair of power supply terminals including a high-power supply terminal T1 and a low-power supply terminal T2 provided on the outer surface of the package 10. Power supply potential VDD is supplied to the high-power supply terminal T1. Reference potential VSS is supplied to the low-power supply terminal T2. In this embodiment, ground potential (0 V) is supplied to the low-power supply terminal T2 as the reference potential VSS. A voltage VDD between the high-power supply terminal T1 and the low-power supply terminal T2 is a power supply voltage.

The first bias circuit section 5 generates a reference current Iref1 on the basis of the power supply voltage VDD and supplies the reference current Iref1 to the digital input section 2. The first bias circuit section 5 is, for example, a current regulator.

The power supply voltage VDD and the reference current Iref1 from the first bias circuit section 5 are supplied to the digital input section 2. A digital signal Sin for controlling an oscillation frequency of the oscillation circuit section 4 is input to the digital input section 2 from the outside of the oscillator 1 via an input terminal T3 provided on the outer surface of the package 10. The digital input section 2 outputs a digital signal S1. The digital input section 2 determines a high level and a low level of the digital signal Sin on the basis of the reference current 'ref' and level-shifts a voltage value of the high level to the power supply voltage VDD to generate the digital signal S1. Note that the digital signal Sin may be formed by a plurality of digital signals. In this case, the plurality of digital signals are respectively input from a different plurality of input terminals. The digital signal Sin may be formed by, for example, a serial data signal and a clock signal or may be formed by a serial data signal, a clock signal, or a chip select signal.

The power supply voltage VDD is supplied to the digital operation section 3. The digital operation section 3 generates, on the basis of the digital signal S1 output from the digital input section 2, a control signal S2 for controlling an oscillation frequency of the oscillation circuit section 4 and outputs the control signal S2 to the oscillation circuit section 4. For example, a variable capacitance array including a plurality of variable capacitance elements and a plurality of switches is provided in the oscillation circuit section 4. The digital operation section 3 may output the control signal S2, which is a digital signal for controlling ON/OFF of the plurality of switches, on the basis of the digital signal S1. For example, the digital operation section 3 may include a D/A conversion circuit (DAC: Digital to Analog Converter) that converts a signal based on the digital signal S1 into an analog signal. A voltage of the control signal S2 based on the analog signal may be applied between terminals of the variable capacitance elements provided in the oscillation circuit section 4.

The second bias circuit section 6 is provided separately from the first bias circuit section 5. The second bias circuits section 6 generates a reference current Iref2 on the basis of the power supply voltage VDD and supplies the reference current Iref2 to the oscillation circuit section 4. The second bias circuit section 6 is, for example, a current regulator. However, the second bias circuit section 6 may be a voltage regulator that generates a reference voltage on the basis of the power supply voltage VDD and supplies the reference voltage to the oscillation circuit section 4. Alternatively, the second bias circuit section 6 may generate a reference current and a reference voltage on the basis of the power supply voltage VDD and supply the reference current and the reference voltage to the oscillation circuit section 4.

The power supply voltage VDD and the reference current Iref2 (or the reference voltage) from the second bias circuit section 6 are supplied to the oscillation circuit section 4. The control signal S2 output by the digital operation section 3 is input to the oscillation circuit section 4. The oscillation circuit section 4 causes the resonator 7 to resonate to generate an oscillation signal Sout having a frequency corresponding to the control signal S2 and outputs the oscillation signal Sout to the outside of the oscillator 1 via an output terminal T4 provided on the outer surface of the package 10. The oscillation circuit section 4 may include, for example, an amplification circuit that amplifies a signal output from the resonator 7 and feeds back the signal to the resonator 7 and an output circuit that generates the oscillation signal Sout from the signal amplified by the amplification circuit and outputs the oscillation signal Sout.

The resonator 7 may be an electric resonance circuit or may be an electromechanical resonator or the like. The resonator 7 may be, for example, a vibrator. The vibrator may be, for example, a piezoelectric vibrator, a SAW (Surface Acoustic Wave) resonator, or a MEMS (Micro Electro Mechanical Systems) vibrator. As a substrate material of the vibrator, a piezoelectric material such as a piezoelectric single crystal such as quartz crystal, lithium tantalate, or lithium niobate or piezoelectric ceramics such as lead zirconate titanate, a silicon semiconductor material, or the like can be used. As exciting means for the vibrator, exciting means by a piezoelectric effect may be used or electrostatic driving by a Coulomb force may be used. The resonator 7 may be an optical resonator that uses a gas cell that stores alkali metal or the like on the inside and light interacting with atoms of the alkali metal or the like, a hollow type resonator or a dielectric resonator that resonates in a microwave region, an LC resonator, or the like.

Various oscillation circuits such as a pierce oscillation circuit, an inverter-type oscillation circuit, a Colpitts oscillation circuit, and a Hartley oscillation circuit may be configured by the oscillation circuit section 4 and the resonator 7.

In FIG. 1, there is only one power supply terminal pair of the oscillator 1 (in FIG. 2, a pair of the high-power supply terminal T1 and the low-power supply terminal T2). Consequently, it is possible to reduce the oscillator 1 in size and output the oscillation signal Sout if only a power supply voltage of one system is supplied to the oscillator 1. Therefore, the oscillator 1 can be used as a clock source of a system. However, the oscillator 1 according to this embodiment may include two or more power supply terminal pairs.

The oscillator 1 according to this embodiment is a digitally controlled oscillator in which a frequency (an oscillation frequency) of the oscillation signal Sout output from the output terminal changes according to the digital signal Sin input via the input terminal T3. The oscillator is used in a system in which an oscillation frequency dynamically changes when the digital signal Sin, a setting value of which changes at every moment, is supplied from an external IC.

Figure 3:
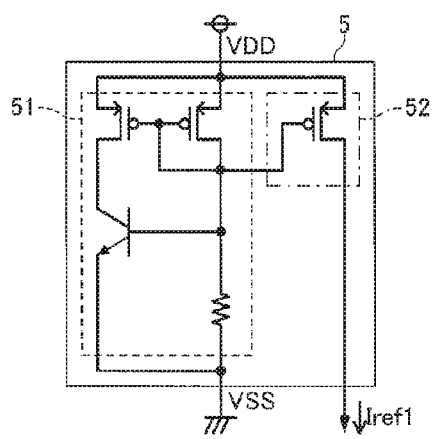
FIG. 3 is a diagram showing a configuration example of a first bias circuit section in the first embodiment.

FIG. 3 is a diagram showing a configuration example of the first bias circuit section 5. In the example shown in FIG. 3, the first bias circuit section 5 includes a bias-voltage generation circuit 51 and a constant current source 52. The bias-voltage generation circuit 51 generates a fixed bias voltage on the basis of the power supply voltage VDD. The constant current source 52 outputs the reference current Iref1 corresponding to the bias voltage generated by the bias-voltage generation circuit 51. Note that the configuration of the second bias circuit section 6 may be the same as the configuration shown in FIG. 3.

Figure 4:
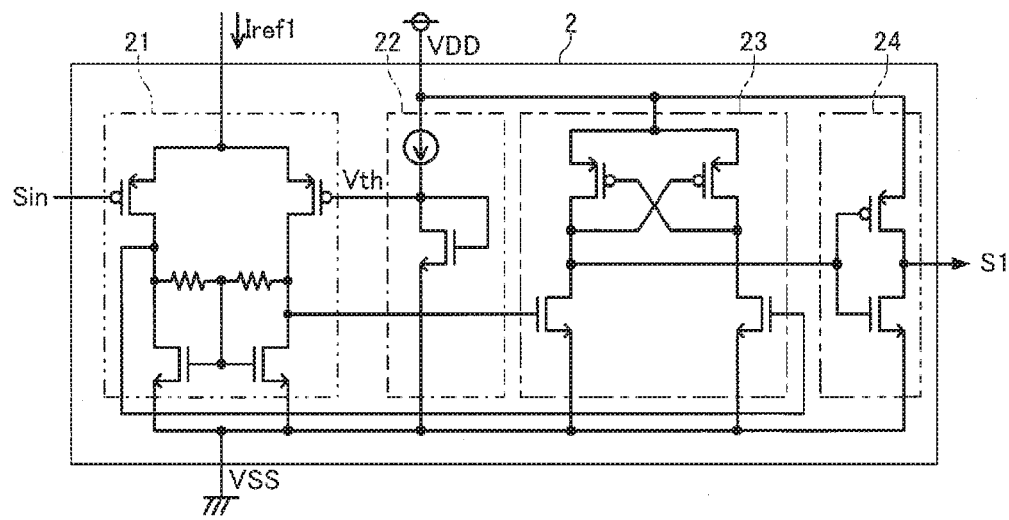
FIG. 4 is a diagram showing a configuration example of a digital input section in the first embodiment.

FIG. 4 is a diagram showing a configuration example of the digital input section 2. In the example shown in FIG. 4, the digital input section 2 includes a differential input circuit 21, a threshold-voltage generation circuit 22, a level shift circuit 23, and a CMOS inverter circuit 24. As shown in FIG. 4, the digital input section 2 includes MOS transistors. That is, the differential input circuit 21, the threshold-voltage generation circuit 22, the level shift circuit 23, and the CMOS inverter circuit 24 are configured using the MOS transistors.

The reference current Iref1 is supplied to the differential input circuit 21. The differential input circuit 21 compares voltages of the digital signal Sin respectively input to gate terminals of two PMOS transistors forming a differential input pair and a threshold voltage Vth and outputs a differential signal indicating a comparison result to the level shift circuit 23.

The threshold-voltage generation circuit 22 is a circuit that generates a fixed threshold voltage Vth on the basis of the power supply voltage VDD using a current source and an NMOS transistor. The threshold voltage Vth is set to a desired voltage corresponding to a gate size (W/L) of the NMOS transistor and a current value of the current source, for example, a voltage lower than VDD/2.

The level shift circuit 23 generates, on the basis of the differential signal indicating the comparison result by the differential input circuit 21, a signal for setting the power supply potential VDD to the high level and setting the reference potential VSS (0 V) to the low level. Specifically, the level shift circuit 23 generates a digital signal that changes to the low level (the reference potential VSS (0 V)) when the voltage of the digital signal Sin is higher than the threshold voltage Vth and changes to the high level (the power supply potential VDD) when the voltage of the digital signal Sin is lower than the threshold voltage Vth and outputs the digital signal to the CMOS inverter circuit 24.

The CMOS inverter circuit 24 inverts the polarity of the output signal of the level shift circuit 23 and outputs the signal. Specifically, the CMOS inverter circuit 24 outputs the digital signal S1 that changes to the low level (the reference potential VSS (0 V)) when the output signal of the level shift circuit 23 is at the high level and changes to the high level (the power supply potential VDD) when the output signal of the level shift circuit 23 is at the low level.

The digital input section 2 configured in this way outputs the digital signal S1 that changes to the high level (the power supply potential VDD) when the voltage of the digital signal Sin is higher than the threshold voltage Vth and changes to the low level (the reference potential VSS (0 V)) when the voltage of the digital signal Sin is lower than the threshold voltage Vth. Therefore, if the amplitude of the digital signal Sin is larger than the threshold voltage Vth and equal to or smaller than the power supply voltage VDD, it is possible to correctly determine the high level and the low level of the digital signal Sin. Therefore, it is possible to reduce the limitation of the amplitude of the digital signal Sin. The fixed reference current Iref1 always flows to the differential input circuit 21. Therefore, a peak current flowing to the power supply terminals T1 and T2 when the polarity of the digital signal Sin changes is small. It is possible to reduce the likelihood of modulation of the oscillation signal Sout due to noise propagated to the oscillation circuit section 4 by the peak current.

Figure 5:
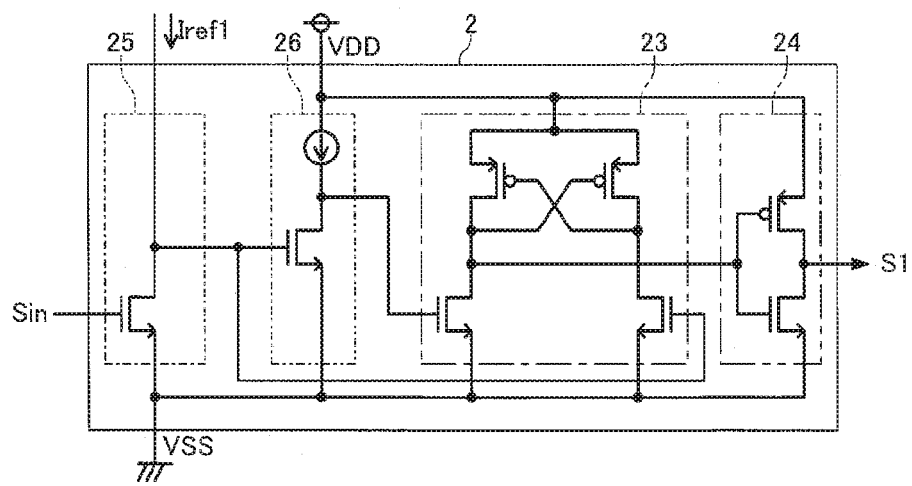
FIG. 5 is a diagram showing another configuration example of the digital input section in the first embodiment.

FIG. 5 is a diagram showing another configuration example of the digital input section 2. In the example shown in FIG. 5, the digital input section 2 includes an inverter circuit 25, an inverter circuit 26, the level shift circuit 23, and the CMOS inverter circuit 24. As shown in FIG. 5, the digital input section 2 includes MOS transistors. That is, the inverter circuit 25, the inverter circuit 26, the level shift circuit 23, and the CMOS inverter circuit 24 are configured using the MOS transistors.

The reference current Iref1 is supplied to the inverter circuit 25. The inverter circuit 25 outputs a signal, a voltage of which (a drain voltage of an NMOS transistor) changes according to a voltage of the digital signal Sin input to a gate terminal of the NMOS transistor. Specifically, the inverter circuit 25 outputs a signal having a lower voltage as the voltage of the digital signal Sin is higher.

The inverter circuit 26 outputs a signal, a voltage of which (a drain voltage of an NMOS transistor) changes according to an output voltage of the inverter circuit 25 input to a gate terminal of the NMOS transistor. Specifically, the inverter circuit 26 outputs a signal having a lower voltage as the output voltage of the inverter circuit 25 is higher.

When the voltage of the digital signal Sin is higher than the threshold voltage Vth, the voltage of the output signal of the inverter circuit 25 is lower than the voltage of the output signal of the inverter circuit 26. When the voltage of the digital signal Sin is lower than the threshold voltage Vth, the voltage of the output signal of the inverter circuit 25 is higher than the voltage of the output signal of the inverter circuit 26. The threshold voltage Vth is set to a desired voltage corresponding to a gate size (W/L) of the NMOS transistor of the inverter circuit 25, a gate size (W/L) of the NMOS transistor of the inverter circuit 26, and a current value of the current source, for example, a voltage lower than VDD/2.

The level shift circuit 23 generates, on the basis of the output signal of the inverter circuit 25 and the output signal of the inverter circuit 26, a signal for setting the power supply potential VDD to the high level and setting the reference potential VSS (0 V) to the low level. Specifically, the level shift circuit 23 generates a digital signal that changes to the low level (the reference potential VSS (0 V)) when the output voltage of the inverter circuit 25 is lower than the output voltage of the inverter circuit 26 (when the voltage of the digital signal Sin is higher than the threshold voltage Vth) and changes to the high level (the power supply potential VDD) when the output voltage of the inverter circuit 25 is higher than the output voltage of the inverter circuit 26 (when the voltage of the digital signal Sin is lower than the threshold voltage Vth) and outputs the digital signal to the CMOS inverter circuit 24.

The CMOS inverter circuit 24 inverts the polarity of the output signal of the level shift circuit 23 and outputs the digital signal S1, the high level of which is the power supply potential VDD and the low level of which is the reference potential VSS (0 V).

The digital input section 2 configured in this way outputs the digital signal S1 that changes to the high level (the power supply potential VDD) when the voltage of the digital signal Sin is higher than the threshold voltage Vth and changes to the low level (the reference potential VSS (0 V)) when the voltage of the digital signal Sin is lower than the threshold voltage Vth. Therefore, if the amplitude of the digital signal Sin is larger than the threshold voltage Vth and equal to or smaller than the power supply voltage VDD, it is possible to correctly determine the high level and the low level of the digital signal Sin. Therefore, it is possible to reduce the limitation of the amplitude of the digital signal Sin. The fixed reference current Iref1 always flows to the differential input circuit 21. Therefore, a peak current flowing to the power supply terminals T1 and T2 when the polarity of the digital signal Sin changes is small. It is possible to reduce the likelihood of modulation of the oscillation signal Sout due to noise propagated to the oscillation circuit section 4 by the peak current. Further, the digital input section 2 of the configuration shown in FIG. 5 is realized by a smaller number of elements compared with the digital input section 2 of the configuration shown in FIG. 4. Therefore, the configuration shown in FIG. 5 is advantageous for a reduction in size.

Figure 6A:
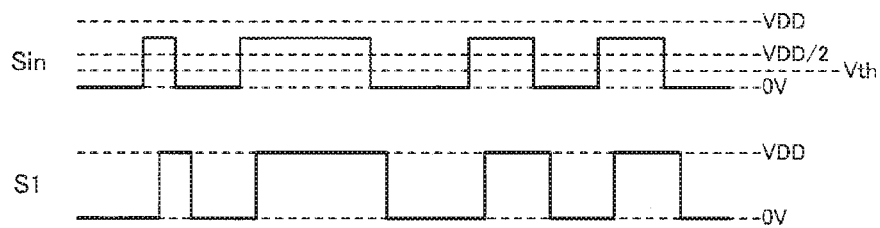
FIGS. 6A to 6C are diagrams showing examples of input and output waveforms of the digital input section.
Figure 6B:
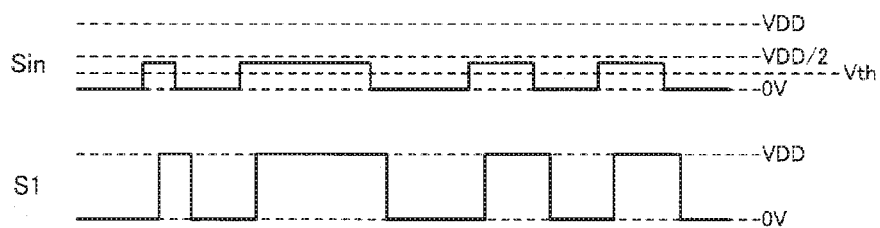
Figure 6C:
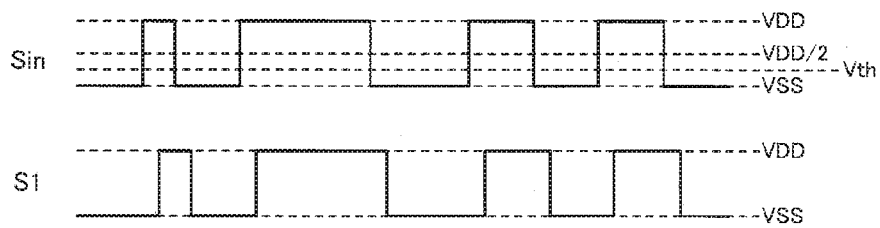

FIGS. 6A to 6C are diagrams showing examples of waveforms of the digital signal Sin (an input signal of the digital input section 2) and the digital signal S1 (an output signal of the digital input section 2) at the time when the threshold voltage Vth is set to a value lower than VDD/2.

In the example shown in FIG. 6A, the high level of the digital signal Sin is a predetermined voltage higher than VDD/2 and lower than VDD. The low level of the digital signal Sin is 0 V. In the example shown in FIG. 6B, the high level of the digital signal Sin is a predetermined voltage higher than Vth and lower than VDD/2. The low level of the digital signal Sin is 0 V. In the example shown in FIG. 6C, the high level of the digital signal Sin is VDD and the low level of the digital signal Sin is 0 V. In all the examples shown in FIGS. 6A to 6C, the high level of the digital signal S1 is VDD and the low level of the digital signal S1 is 0 V.

Figure 7:
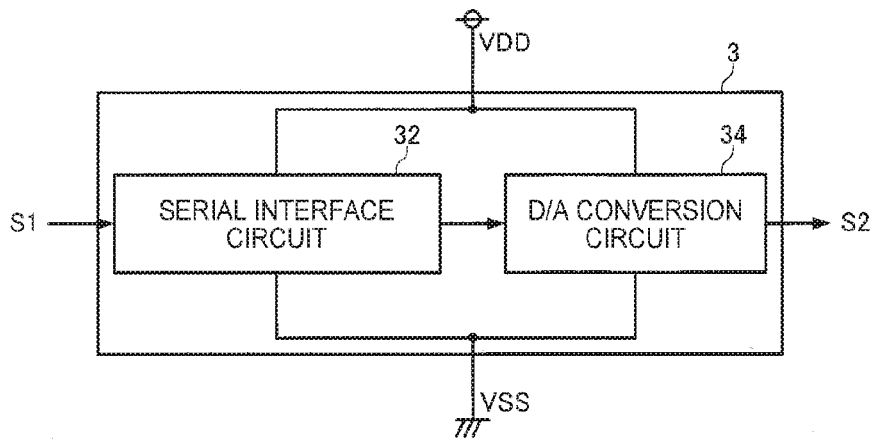
FIG. 7 is a diagram showing a configuration example of a digital operation section.

FIG. 7 is a diagram showing a configuration example of the digital operation section 3 shown in FIG. 2. In the example shown in FIG. 7, the digital operation section 3 includes a serial interface circuit 32 and a D/A conversion circuit 34, both of which operate with VDD set as power supply potential and with VSS set as reference potential.

The digital signal S1 output by the digital input section 2 is input to the serial interface circuit 32. The serial interface circuit 32 serial/parallel-converts a serial data signal included in the digital signal S1 into an N-bit data signal and outputs the N-bit data signal to the D/A conversion circuit 34. The serial interface circuit 32 may be, for example, an interface circuit (e.g., an interface circuit adapted to an I²C (Inter-Integrated Circuit) bus) to which a serial data signal and a clock signal are input as the digital signal S1 or may be an interface circuit (e.g., an interface circuit adapted to an SPI (Serial Peripheral Interface) bus to which a serial data signal, a clock signal, and a chip select signal are input as the digital signal S1.

The D/A conversion circuit 34 converts the N-bit data signal output by the serial interface circuit 32 into an analog signal and outputs the analog signal. The digital operation section 3 outputs the output signal of the D/A conversion circuit 34 as the control signal S2. As the D/A conversion circuit 34, well-known D/A conversion circuits of various types such as a resistance division type (referred to as voltage distribution type, resistance string type, or voltage potentiometer type as well), a resistance ladder type (an R-2R ladder type, etc.), a capacitance array type, and a delta/sigma type can be used.

Figure 8:
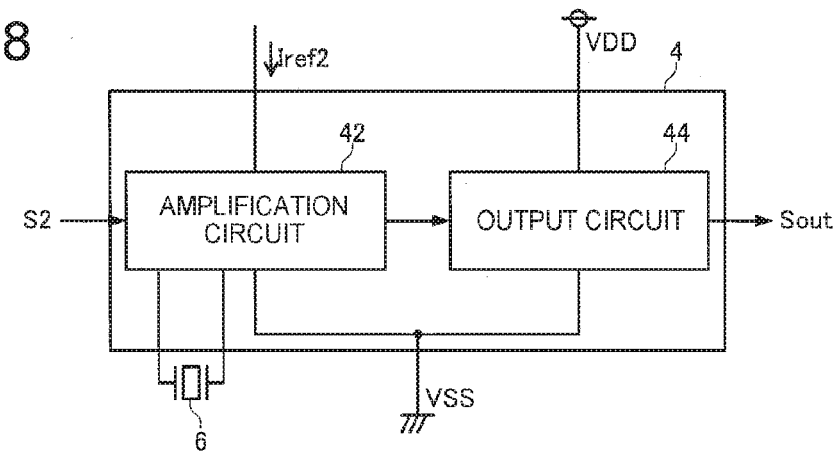
FIG. 8 is a diagram showing a configuration example of an oscillation circuit section.

FIG. 8 is a diagram showing a configuration example of the oscillation circuit section 4 shown in FIG. 2. In the example shown in FIG. 8, the oscillation circuit section 4 includes an amplification circuit 42 that operates with VSS set as reference potential and according to the reference current Iref2 supplied from the second bias circuit section 6 and an output circuit 44 that operates with VDD set as power supply potential and with VSS set as reference potential.

For example, the amplification circuit 42 amplifies a signal output from the resonator 7 by a bipolar transistor operating with the reference current Iref2 and feeds back the amplified signal to the resonator 7 to cause the resonator 7 to resonate. The amplification circuit 42 includes a not-shown variable capacitance element functioning as load capacitance of the resonator 7. A capacitance value of the variable capacitance element is controlled by the control signal S2 output by the digital operation section 3. An oscillation frequency of the resonator 7 changes according to the capacitance value of the variable capacitance element.

For example, the output circuit 44 buffers or level-shifts the signal amplified by the amplification circuit (the input signal of the resonator 7) to generate the oscillation signal Sout and outputs the oscillation signal Sout. For example, the output circuit 44 may generate the oscillation signal Sout of a CMOS level or may generate the oscillation signal Sout corresponding to any one of standards such as an LVPECL (Low-Voltage Positive-referenced Emitter Coupled Logic), an LVDS (Low-Voltage Differential Signals), and an HCSL (High-speed Current Steering Logic).

An oscillation circuit configured by the oscillation circuit section 4 and the resonator 7 functions as a voltage-controlled oscillation circuit that outputs the oscillation signal Sout having a frequency corresponding to the voltage of the control signal S2.

Note that, in this embodiment, according to a use or the like of the oscillator 1, the power supply voltage VDD is any voltage in a range of 0.6 V or more and 3.96 V or less. A lower limit value of a voltage that can be output by a general step-down regulator (a step-down type converter) is 0.6 V. The oscillator 1 according to this embodiment may be an oscillator that operates with low power consumption using a minimum output voltage (0.6 V) of the step-down regulator as the power supply voltage VDD and outputs, for example, an oscillation signal of a CMOS level. Therefore, a lower limit value of the power supply voltage VDD is set to 0.6 V. The oscillator 1 may be an oscillator that operates using, as the power supply voltage VDD, a maximum output voltage (3.96 V) of a power supply having output voltage accuracy of 3.3 V±20% among 3.3V power supplies widely in use and outputs, for example, an oscillation signal corresponding to the LVPECL. Therefore, an upper limit value of the power supply voltage VDD is set to 3.96 V.

As explained above, in the oscillator 1 according to the first embodiment, the digital input section 2 compares, on the basis of the reference current Iref1 supplied from the first bias circuit section 5 rather than a predetermined reference voltage, the voltage of the digital signal Sin input from the input terminal T3 with the threshold voltage Vth and determines that the digital signal Sin is at the low level when the voltage of the digital signal Sin is higher than the threshold voltage Vth and is at the high level when the voltage of the digital signal Sin is lower than the threshold voltage Vth. The threshold voltage Vth can also be set to a voltage lower than VDD/2. Therefore, it is possible to define specifications of an input level of the digital signal Sin such that an allowable range of a high level input of the digital signal Sin is wider than in the past with respect to the power supply voltage VDD determined according to a use or the like of the oscillator 1.

Figure 9:
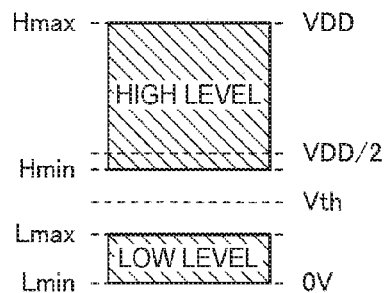
FIG. 9 is an explanatory diagram of an example of specifications of an input level of a digital signal.

FIG. 9 is a diagram for explaining an example of the specifications of the input level of the digital signal Sin. In the oscillator 1 according to this embodiment, as the specifications of the input level of the digital signal Sin, at least a minimum input voltage Hmin of the high level (a lower limit voltage allowed as a high level input) and a maximum input voltage Lmax of the low level (an upper limit voltage allowed as a low level input) are specified. In the example shown in FIG. 9, the minimum input voltage Hmin of the high level is specified as a voltage value lower than VDD/2 and higher than the threshold voltage Vth and the maximum input voltage Lmax of the low level is specified as a value lower than the threshold voltage Vth.

Further, as the specifications of the input level of the digital signal Sin, a maximum input voltage Hmax of the high level (an upper limit voltage allowed as the high level input) and a minimum input voltage Lmin of the low level (a lower limit voltage allowed as the low level input) may be specified. In the example shown in FIG. 9, the maximum input voltage Hmax of the high level is VDD and the minimum input voltage Lmin of the low level is 0 V.

In this way, in the oscillator 1 according to this embodiment, it is also possible to specify an input range of the high level of the digital signal Sin in a range of a predetermined voltage, which is lower than VDD/2, or more and VDD or less. For example, compared with a range of 0.7 VDD or more and VDD or less in an oscillator of a CMOS input, an allowable range of the input range can be set extremely wide.

Therefore, when an IC that outputs the digital signal Sin to the oscillator 1 operates at a power supply voltage higher than Hmin and equal to or lower than VDD, it is unnecessary to increase the amplitude of the digital signal Sin to VDD with a level shift circuit on the inside of the IC. Therefore, it is possible to suppress an increase in power consumption of the IC and the oscillator 1 and an increase in noise received by the oscillator 1.

Note that, even in a circuit configuration in which the first bias circuit section 5 supplies a reference voltage Vref, which is a voltage same as a power supply voltage of an external IC, to the digital input section 2 and the digital input section 2 determines the high level and the low level of the voltage of the digital signal Sin, it is also unnecessary to increase the amplitude of the digital signal Si to VDD with a level shift circuit on the inside of the IC. However, it is not allowed to replace the IC with an IC having a power supply voltage of VDD because it is likely that breakage of a circuit element in the digital input section 2 of the oscillator 1 is caused. On the other hand, in the oscillator 1 according to this embodiment, it is possible to connect any IC that operates at a power supply voltage higher than Hmin and equal to or lower than VDD.

In the oscillator 1 according to this embodiment, the first bias circuit section 5 that supplies the reference current Iref1 to the digital input section 2 and the second bias circuit section 6 that supplies the reference current Iref2 to the oscillation circuit section 4 are separated. Therefore, it is possible to reduce the likelihood that noise occurring in the digital input section 2 is propagated to the oscillation circuit section 4 and the oscillation signal Sout is modulated by the noise.

1-2. Second Embodiment

Figure 10:
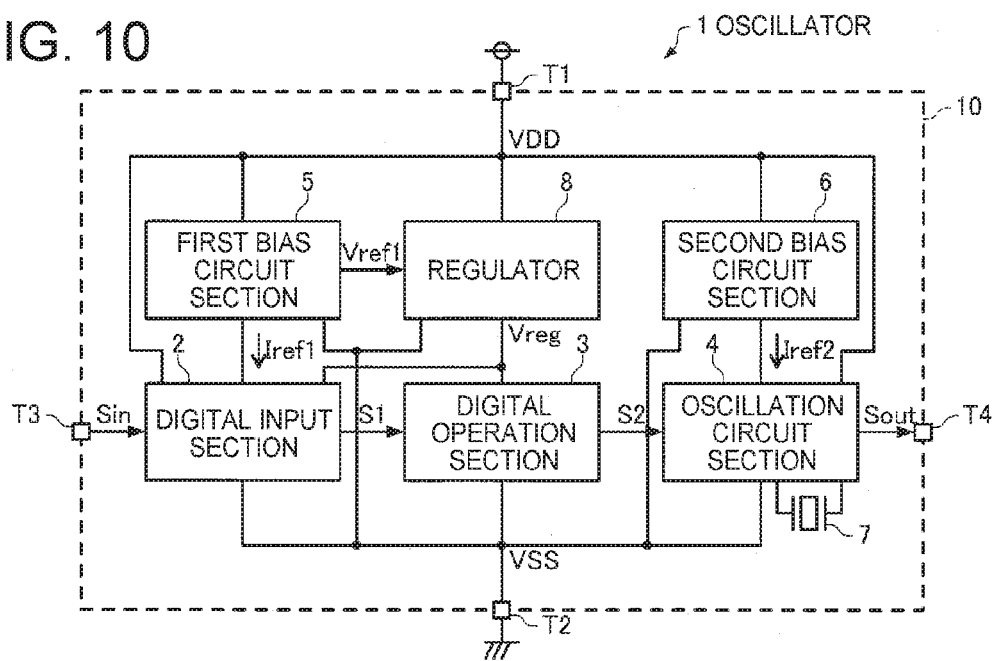
FIG. 10 is a diagram showing the configuration of an oscillator according to a second embodiment.

As in the first embodiment, an oscillator according to a second embodiment is a digitally controlled oscillator in which an oscillation frequency can be controlled according to a digital signal input from an external terminal. In the oscillator according to the second embodiment, components same as the components in the first embodiment are denoted by the same reference numerals and signs. In the following explanation, redundant explanation is omitted and differences from the first embodiment are mainly explained. FIG. 10 is a diagram showing the configuration of the oscillator according to the second embodiment. As shown in FIG. 10, the oscillator 1 according to the second embodiment includes the digital input section 2, the digital operation section 3, the oscillation circuit section 4, the first bias circuit section 5, the second bias circuit section 6, a regulator 8, and the resonator 7 and the package (the container) 10 in which these components are mounted. The digital input section 2, the digital operation section 3, the oscillation circuit section 4, the first bias circuit section 5, the second bias circuit section 6, and the regulator 8 may be configured by one integrated circuit (IC), may be configured to be divided into a plurality of integrated circuits (ICs), or may be partially configured by discrete components. The integrated circuit (IC) is manufactured by, for example, a CMOS process or BiCMOS process. Note that the oscillator 1 according to this embodiment may be configured by omitting or changing a part of the components shown in FIG. 10 or adding other components.

As in the first embodiment, the oscillator 1 according to the second embodiment operates using, as a power supply voltage, a voltage between the pair of power supply terminals including the high-power supply terminal T1 and the low-power supply terminal T2 provided on the outer surface of the package 10. The power supply potential VDD is supplied to the high-power supply terminal T1 and the reference potential VSS is supplied to the low-power supply terminal T2.

The functions and the configurations of the oscillation circuit section 4 and the second bias circuit section 6 are the same as the functions and the configurations in the first embodiment.

The first bias circuit section 5 generates the reference current Iref1 on the basis of the power supply voltage VDD, supplies the reference current Iref1 to the digital input section 2, and supplies a reference voltage Vref1 to the regulator 8.

The regulator 8 is a voltage regulator that generates a fixed voltage Vreg from the power supply voltage VDD on the basis of the reference voltage Vref1 supplied from the first bias circuit section 5 and outputs the fixed voltage Vreg to the digital operation section 3.

As in the first embodiment, the power supply voltage VDD and the reference current Iref1 from the first bias circuit section 5 are supplied to the digital input section 2. The digital signal Sin for controlling an oscillation frequency of the oscillation circuit section 4 is input to the digital input section 2 from the outside of the oscillator 1 via the input terminal T3 provided on the outer surface of the package 10. The digital input section 2 outputs the digital signal S1. The digital input section 2 determines a high level and a low level of the digital signal Sin on the basis of the reference current Iref1 and level-shifts a voltage value of the high level to the voltage Vreg to generate the digital signal S1.

Using the voltage Vreg supplied from the regulator 8 as a power supply voltage (an operating voltage), the digital operation section 3 generates, on the basis of the digital signal S1 output from the digital input section 2, the control signal S2 for controlling an oscillation frequency of the oscillation circuit section 4 and outputs the control signal S2 to the oscillation circuit section 4.

Figure 11:
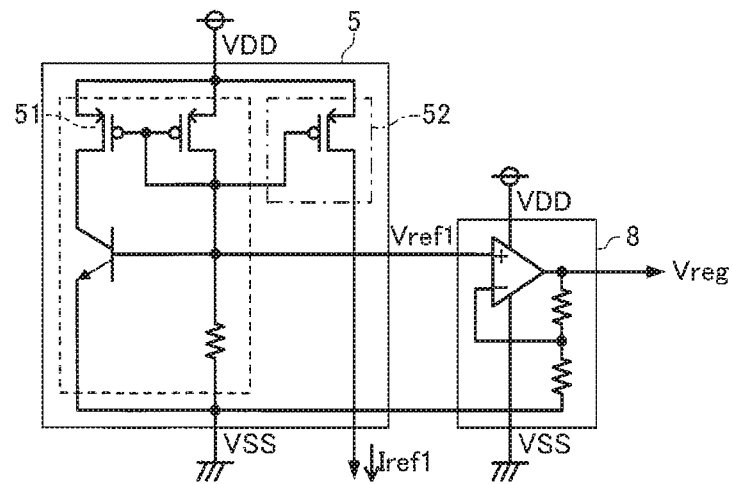
FIG. 11 is a diagram showing a configuration example of a first bias circuit section and a regulator in the second embodiment.

FIG. 11 is a diagram showing a configuration example of the first bias circuit section 5 and the regulator 8. In the example shown in FIG. 11, the first bias circuit section 5 includes a configuration same as the configuration shown in FIG. 3. The first bias circuit section 5 outputs a base voltage of a bipolar transistor included in the bias-voltage generation circuit 51 as the reference voltage Vref1. The regulator 8 is configured by an operational amplifier and a non-inverting amplification circuit by resistance. The regulator 8 outputs an output voltage of the operational amplifier as the fixed voltage Vreg.

Figure 12:
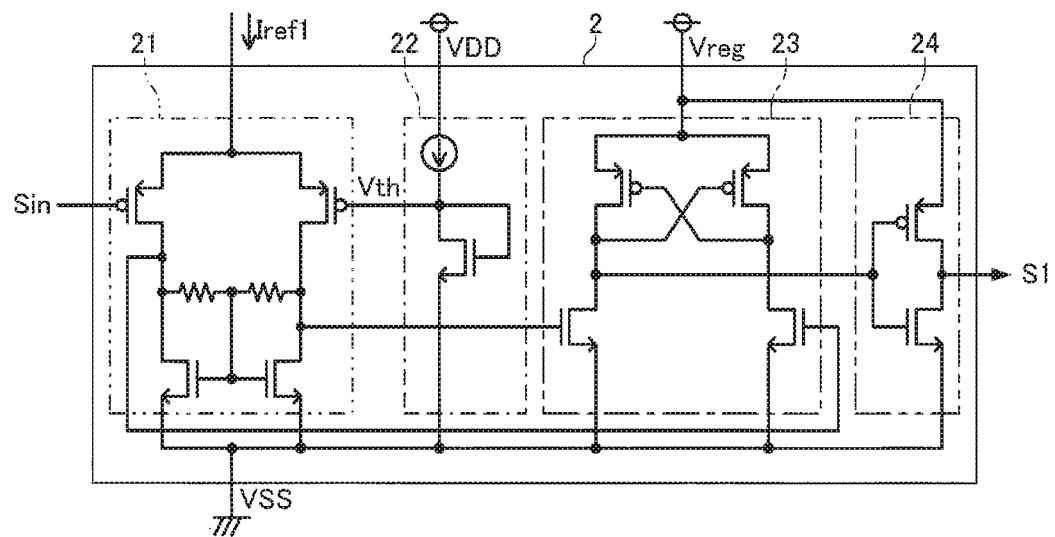
FIG. 12 is a diagram showing a configuration example of a digital input section in the second embodiment.

FIG. 12 is a diagram showing a configuration example of the digital input section 2. In the example shown in FIG. 12, as in FIG. 4, the digital input section 2 includes the differential input circuit 21, the threshold-voltage generation circuit 22, the level shift circuit 23, and the CMOS inverter circuit 24. The configurations of the differential input circuit 21 and the threshold-voltage generation circuit 22 are the same as the configurations shown in FIG. 4.

The level shift circuit 23 generates, on the basis of the differential signal indicating the comparison result by the differential input circuit 21, a signal for setting Vreg to the high level and setting VSS (0 V) to the low level. Specifically, the level shift circuit 23 generates a digital signal that changes to the low level (VSS (0 V)) when the voltage of the digital signal Sin is higher than the threshold voltage Vth and changes to the high level (Vreg) when the voltage of the digital signal Sin is lower than the threshold voltage Vth and outputs the digital signal to the CMOS inverter circuit 24.

The CMOS inverter circuit 24 inverts the polarity of the output signal of the level shift circuit 23 and outputs the signal. Specifically, the CMOS inverter circuit 24 outputs the digital signal S1 that changes to the low level (VSS (0

V)) when the output signal of the level shift circuit 23 is at the high level and changes to the high level (Vreg) when the output signal of the level shift circuit 23 is at the low level.

The digital input section 2 configured in this way outputs the digital signal S1 that changes to the high level (Vreg) when the voltage of the digital signal Sin is higher than the threshold voltage Vth and changes to the low level (VSS (0 V)) when the voltage of the digital signal Sin is lower than the threshold voltage Vth.

Figure 13:
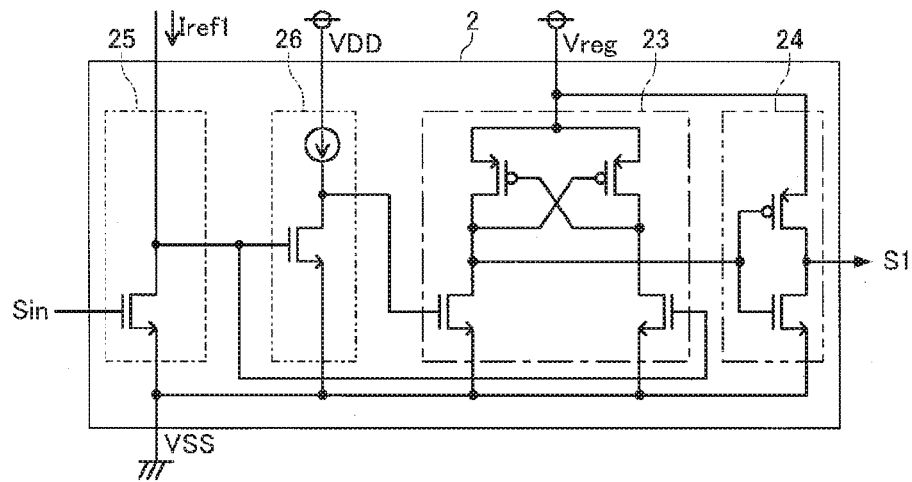
FIG. 13 is a diagram showing another configuration example of the digital input section in the second embodiment.

FIG. 13 is a diagram showing another configuration example of the digital input section 2. In the example shown in FIG. 13, as in FIG. 5, the digital input section 2 includes the inverter circuit 25, the inverter circuit 26, the level shift circuit 23, and the CMOS inverter circuit 24. The configurations of the inverter circuit 25 and the inverter circuit 26 are the same as the configurations shown in FIG. 5.

The level shift circuit 23 generates, on the basis of the output signal of the inverter circuit 25 and the output signal of the inverter circuit 26, a signal for setting Vreg to the high level and setting VSS (0 V) to the low level. Specifically, the level shift circuit 23 generates a digital signal that changes to the low level (VSS (0 V)) when the output voltage of the inverter circuit 25 is lower than the output voltage of the inverter circuit 26 (when the voltage of the digital signal Sin is higher than the threshold voltage Vth) and changes to the high level (Vreg) when the output voltage of the inverter circuit 25 is higher than the output voltage of the inverter circuit 26 (when the voltage of the digital signal Sin is lower than the threshold voltage Vth) and outputs the digital signal to the CMOS inverter circuit 24.

The CMOS inverter circuit 24 inverts the polarity of the output signal of the level shift circuit 23 and outputs the digital signal S1, the high level of which is Vreg and the low level of which is VSS (0 V).

The digital input section 2 configured in this way outputs the digital signal S1 that changes to the high level (the power supply potential VDD) when the voltage of the digital signal Sin is higher than the threshold voltage Vth and changes to the low level (the reference potential VSS (0 V)) when the voltage of the digital signal Sin is lower than the threshold voltage Vth.

In the oscillator 1 according to the second embodiment, as in the first embodiment, the digital input section 2 compares, on the basis of the reference current Iref1 supplied from the first bias circuit section 5 rather than a predetermined reference voltage, the voltage of the digital signal Sin input from the input terminal T3 with the threshold voltage Vth and determines that the digital signal Sin is at the low level when the voltage of the digital signal Sin is higher than the threshold voltage Vth and is at the high level when the voltage of the digital signal Sin is lower than the threshold voltage Vth. The threshold voltage Vth can also be set to a voltage lower than VDD/2. Therefore, the minimum input voltage Hmin of the high level of the digital signal Sin can be set lower than ½ of the power supply voltage VDD. That is, with the oscillator 1 according to the second embodiment, as in the first embodiment, it is possible to set the minimum input voltage Hmin of the high level of the digital signal Sin lower than VDD/2 while setting the maximum input voltage Hmax of the high level of the digital signal Si to VDD. Therefore, it is possible to expand an allowable range of a high level input of the digital signal Sin.

Therefore, with the oscillator 1 according to the second embodiment, as in the first embodiment, it is possible to connect any IC that operates at a power supply voltage higher than Hmin and equal to or lower than VDD. It is unnecessary to increase the amplitude of the digital signal Sin to VDD with a level shift circuit on the inside of the IC. Therefore, it is possible to suppress an increase in power consumption of the IC and the oscillator 1 and an increase in noise received by the oscillator 1.

With the oscillator 1 according to the second embodiment, as in the first embodiment, the first bias circuit section 5 that supplies the reference current Iref1 to the digital input section 2 and the second bias circuit section 6 that supplies the reference current Iref2 to the oscillation circuit section 4 are separated. Therefore, it is possible to reduce the likelihood that noise occurring in the digital input section 2 is propagated to the oscillation circuit section 4 and the oscillation signal Sout is modulated by the noise.

With the oscillator 1 according to the second embodiment, the digital operation section 3 is caused to operate at the voltage Vreg lower than the power supply voltage VDD. Therefore, it is possible to further reduce power consumption than in the first embodiment.

1-3. Modifications

Various modified implementations of the oscillator 1 according to the first embodiment or the second embodiment are possible. A part of modifications is explained below.

Figure 14:
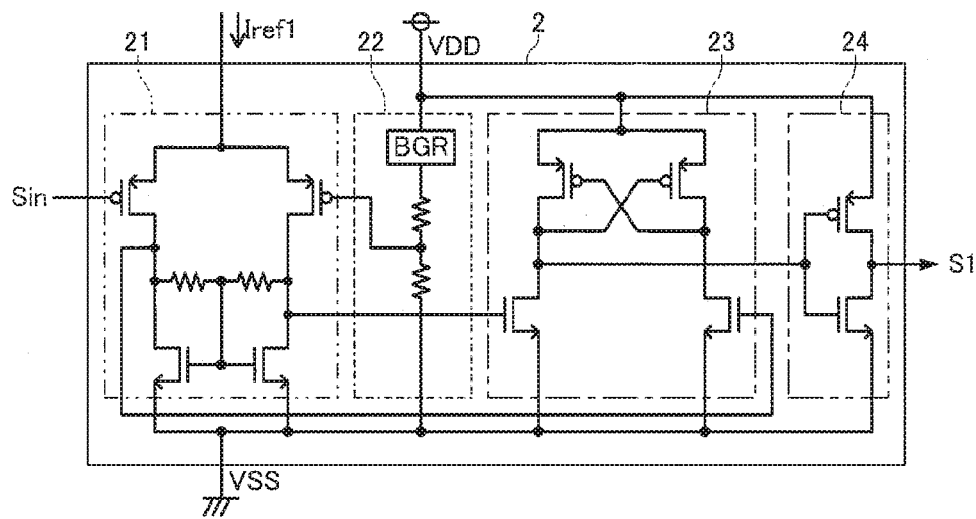
FIG. 14 is a diagram showing a modification of the digital input section.

For example, in the oscillator 1 according to the embodiment, in the configuration shown in FIG. 4 or 12 showing the configuration example of the digital input section 2, the threshold-voltage generation circuit 22 may be configured using a band gap reference (BGR) circuit. As an example, in the digital input section 2 shown in FIG. 14, a configuration in which the threshold-voltage generation circuit 22 is changed to a configuration including the band gap reference (BGR) circuit is shown. In FIG. 14, the configurations of the differential input circuit 21, the level shift circuit 23, and the CMOS inverter circuit 24 are the same as the configurations shown in FIG. 4.

In the example shown in FIG. 14, the threshold-voltage generation circuit 22 divides, with two resistors, a voltage generated by the band gap reference (BGR) circuit on the basis of the power supply voltage VDD and generates the threshold voltage Vth. The threshold voltage Vth is set to a desired voltage corresponding to a ratio (a division ratio) of resistance values of the two resistors, for example, a voltage lower than VDD/2. The band gap reference (BGR) circuit can generate, making use of a band gap of a semiconductor, an extremely stable threshold voltage Vth that hardly fluctuates with respect to fluctuation in a power supply voltage and temperature. Therefore, even if the threshold voltage Vth is set low, the differential input circuit 21 can normally operate. It is also possible to input the digital signal Sin, the high level of which is low (amplitude of which is small).

2. Electronic Apparatus

Figure 15:
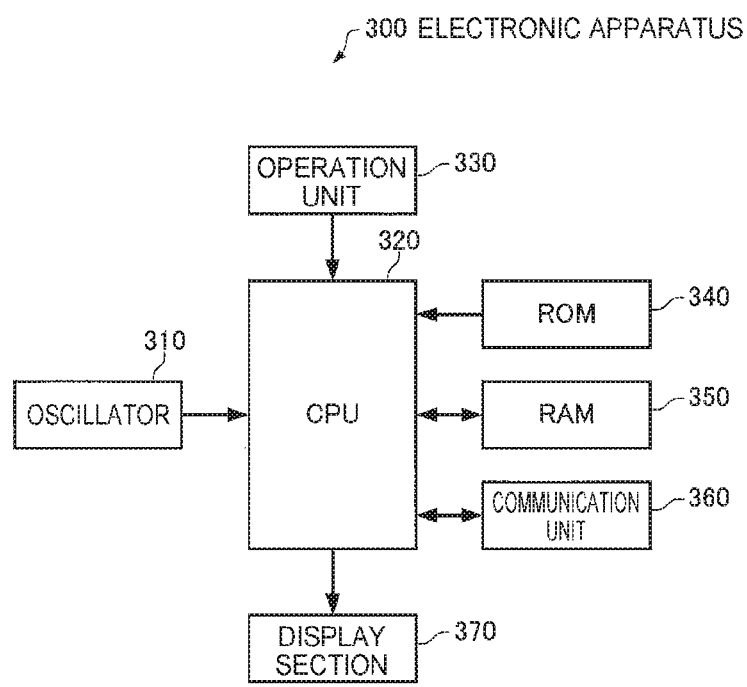
FIG. 15 is a functional block diagram showing an example of the configuration of an electronic apparatus according to an embodiment.

FIG. 15 is a functional block diagram showing an example of the configuration of an electronic apparatus according to an embodiment. An electronic apparatus 300 according to this embodiment includes an oscillator 310, a CPU (Central Processing Unit) 320, an operation section 330, a ROM (Read Only Memory) 340, a RAM (Random Access Memory) 350, a communication section 360, and a display section 370. Note that the electronic apparatus according to this embodiment may be configured by omitting or changing a part of the components (the sections) shown in FIG. 15 or adding other components.

The oscillator 310 incorporates a resonator (not shown in the figure), a circuit for oscillation (not shown in the figure)

that causes the resonator to resonate, and a circuit for control (not shown in the figure) for controlling the circuit for oscillation. The oscillator 310 outputs an oscillation signal by the resonance of the resonator. The oscillation signal is supplied from the oscillator 310 to the CPU 320.

The CPU 320 performs, according to a computer program stored in the ROM 340 or the like, various kinds of calculation processing and control processing using, as a clock signal, the oscillation signal input from the oscillator 310. Specifically, the CPU 320 performs, for example, various kinds of processing corresponding to operation signals from the operation section 330, processing for controlling the communication section 360 in order to perform data communication with an external device, and processing for transmitting a display signal for causing the display section 370 to display various kinds of information.

The operation section 330 is an input device configured by operation keys, button switches, and the like. The operation section 330 outputs an operation signal corresponding to operation by a user to the CPU 320.

The ROM 340 has stored therein computer programs, data, and the like for the CPU 320 to perform the various kinds of calculation processing and control processing.

The RAM 350 is used as a work area of the CPU 320. The RAM 350 temporarily stores, for example, a computer program and data read out from the ROM 340, data input from the operation section 330, and results of arithmetic operations executed by the CPU 320 according to various computer programs.

The communication section 360 performs various kinds of control for establishing the data communication between the CPU 320 and the external device.

The display section 370 is a display device configured by an LCD (Liquid Crystal Display) or the like. The display section 370 displays the various kinds of information on the basis of the display signal input from the CPU 320. A touch panel functioning as the operation section 330 may be provided in the display section 370.

By applying, for example, the oscillator 1 according to the embodiments or the oscillator 1 according to the modifications as the oscillator 310, it is possible to realize the electronic apparatus having high reliability.

As the electronic apparatus 300, various electronic apparatuses are conceivable. Examples of the electronic apparatus 300 include personal computers (e.g., a mobile personal computer, a laptop personal computer, and a tablet personal computer), mobile terminals such as a smart phone and a cellular phone, a digital still camera, an inkjet-type discharge apparatus (e.g., an inkjet printer), a digital PLL (Phase Locked Loop), communication network apparatuses (e.g., storage area network apparatuses such as a router and a switch and a local area network apparatus), an apparatus for mobile terminal base station, a television, a video camera, a video tape recorder, a car navigation apparatus, a real-time clock apparatus, a pager, an electronic notebook (including an electronic notebook with a communication function), an electronic dictionary, an electronic calculator, an electronic game machine, a controller for a game, a word processor, a work station, a video phone, a security television monitor, an electronic binocular, a POS terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), a flight simulator, a head mounted display, motion trace, motion tracking, a motion controller, and PDR (pedestrian dead reckoning).

Examples of the electronic apparatus 300 according to this embodiment include a transmission apparatus that functions as, for example, an apparatus for a terminal base station that performs communication with a terminal by wire or radio using the oscillator 310 as a reference signal source, a variable voltage oscillator (VCO), or the like. By applying, for example, the oscillator 1 according to the embodiments or the oscillator 1 according to the modifications as the oscillator 310, the electronic apparatus 300 according to this embodiment can also be applied to a transmission apparatus desired to have high performance and high reliability usable in, for example, a communication base station.

3. Moving Object

Figure 16:
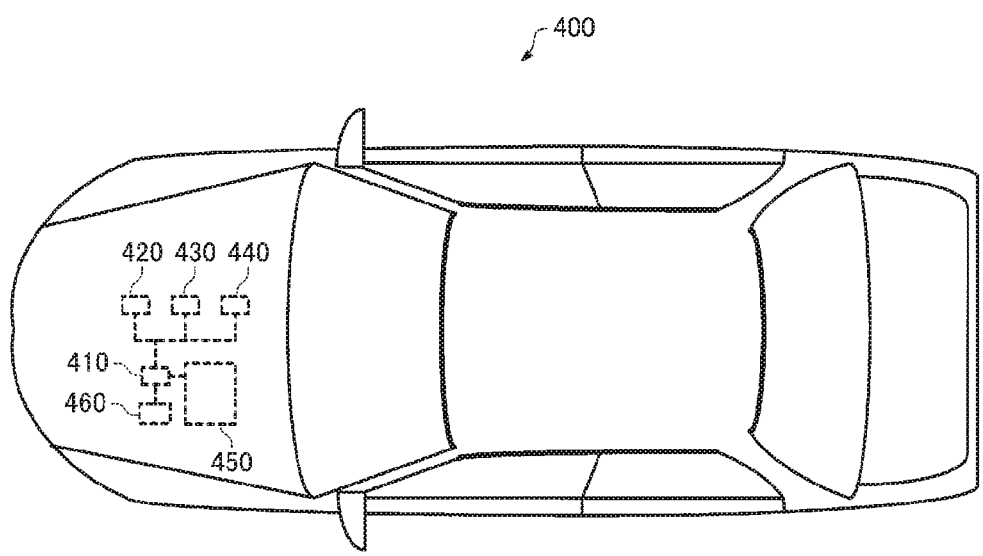
FIG. 16 is a diagram showing an example of a moving object according to an embodiment.

FIG. 16 is a diagram (a top view) showing an example of moving object according to an embodiment. A moving object 400 shown in FIG. 16 includes an oscillator 410, controllers 420, 430, and 440 for performing various kinds of control for an engine system, a brake system, and a key-less entry system, a battery 450, and a backup battery 460. Note that the moving object according to this embodiment may be configured by omitting a part of the components (the sections) shown in FIG. 16 or adding other components.

The oscillator 410 incorporates a resonator (not shown in the figure), a circuit for oscillation (not shown in the figure) that causes the resonator to resonate, and a circuit for control (not shown in the figure) for controlling the circuit for oscillation. The oscillator 410 outputs an oscillation signal by the resonance of the resonator. The oscillation signal is supplied from the oscillator 410 to the controllers 420, 430, and 440 and used as, for example, a clock signal.

The battery 450 supplies electric power to the oscillator 410 and the controllers 420, 430, and 440. The backup battery 460 supplies electric power to the oscillator 410 and the controllers 420, 430, and 440 when an output voltage of the battery 450 drops to a voltage smaller than a threshold.

It is possible to realize the moving object having high reliability by applying, for example, the oscillator 1 according to the embodiments or the oscillator 1 according to the modifications as the oscillator 410.

Various moving objects are conceivable as the moving object 400. Examples of the moving object 400 include an automobile (including an electric vehicle), airplanes such as a jet airplane and a helicopter, a ship, a rocket, and an artificial satellite.

The invention is not limited to the embodiments and various modified implementations are possible without departing from the spirit of the invention.

The embodiments and the modifications explained above are examples. The invention is not limited to the embodiments and the modifications. For example, the embodiment and the modifications can be combined as appropriate.

The invention includes components substantially the same as the components explained in the embodiments (e.g., components having the same functions, methods, and results or components having the same purposes and effects). The invention includes components in which non-essential portions of the components explained in the embodiments are replaced. The invention includes components that can attain action and effects or achieve objects same as those of the components explained in the embodiments. The invention includes components in which publicly-known techniques are added to the components explained in the embodiments.

The entire disclosure of Japanese Patent Application No. 2015-020200, filed Feb. 4, 2015 is expressly incorporated by reference herein.

What is claimed is:

1. An oscillator comprising:
an input terminal to which a first digital signal is input, the first digital signal having first and second voltage values, the first voltage value being higher than the second voltage value;
an oscillation circuit that is configured to output an oscillator signal, an oscillation frequency of the oscillator signal corresponding to the first digital signal;
a digital input circuit that is configured to receive the first digital signal from the input terminal and that is configured to output a second digital signal, the second digital signal corresponding to the first digital signal, the digital input circuit having a first input circuit and a level shift circuit, the second digital signal having third and fourth voltage values, the third voltage value is lower than the fourth voltage value; and
a first bias circuit that has a constant current source, the constant current source being configured to supply a reference current to the digital input circuit,
wherein the first input circuit is located at an upstream side of the level shift circuit in the digital input circuit with respect to a signal flow direction of the first digital signal, and
the first input circuit is configured to receive the first digital signal, the reference current, and a threshold voltage,
the first input circuit is configured to compare the threshold voltage with one of the first and second voltage values of the first digital signal, and to output a differential signal to the level shift circuit,
wherein when the one of the first and second voltage values of the first digital signal is higher than the threshold voltage, the level shift circuit is configured to output the second digital signal having the third voltage value based on the differential signal, and
when the one of the first and second voltage values of the first digital signal is lower than the threshold voltage, the level shift circuit is configured to output the second digital signal having the fourth voltage value based on the differential signal.

2. The oscillator according to claim 1, further comprising a second bias circuit that is configured to supply at least one of an electric current and a voltage to the oscillation circuit.

3. The oscillator according to claim 1,
wherein the digital input circuit includes a MOS transistor.

4. The oscillator according to claim 1, further comprising:
a digital operation circuit that is configured to generate a frequency control signal,
wherein the level shift circuit is configured to output the second digital signal corresponding to either the third voltage value or the fourth voltage value based on the first digital signal,
the digital operation circuit is configured to receive an operation signal based on the second digital signal, and the digital operation circuit is configured to generate the frequency control signal based on the second digital signal, and
the oscillation frequency of the oscillator signal is changed based on the frequency control signal.

5. The oscillator according to claim 4, further comprising a regulator that is configured to supply electric power to the digital operation circuit,
wherein the regulator is configured to receive a reference voltage from the first bias circuit, and the regulator is configured to generate an operation voltage corresponding to the electric power, and
the digital operation circuit is configured to receive the operation voltage.

6. An electronic apparatus comprising the oscillator according to claim 1.

7. An electronic apparatus comprising the oscillator according to claim 2.

8. An electronic apparatus comprising the oscillator according to claim 3.

9. An electronic apparatus comprising the oscillator according to claim 4.

10. A moving object comprising the oscillator according to claim 1.

11. A moving object comprising the oscillator according to claim 2.

12. A moving object comprising the oscillator according to claim 3.

13. The oscillator according to claim 1,
wherein the first input circuit is a differential input circuit.

14. The oscillator according to claim 1,
wherein the first input circuit is configured with first and second inverter circuits, the first inverter circuit is configured to receive the first digital signal and the reference current prior to the first digital signal being received by the second inverter circuit, the first inverter circuit is configured to output a first inverter signal, and the second inverter circuit is configured to output a second inverter signal,
wherein when a first inverter voltage value of the first inverter signal is lower than a second inverter voltage value of the second inverter signal, the level shift circuit is configured to output the second digital signal having the third voltage value, and
when the first inverter voltage value of the first inverter signal is higher than the second inverter voltage value of the second inverter signal, the level shift circuit is configured to output the second digital signal having the fourth voltage value.

15. The oscillator according to claim 4,
wherein the first input circuit is a differential input circuit.

16. The oscillator according to claim 1, further comprising:
a digital operation circuit that is configured to generate a frequency control signal,
wherein the digital input circuit has a CMOS inverter circuit, the level shift circuit is located at an upstream side of the CMOS inverter circuit in the digital input circuit with respect to a signal flow direction of the second digital signal, the CMOS inverter circuit is configured to convert the third and fourth voltage values of the second digital signal to fifth and sixth voltage values of a third digital signal, respectively, and the fifth voltage value is higher than the sixth voltage value,
wherein the digital operation circuit is configured to receive the third digital signal, and the digital operation circuit is configured to generate the frequency control signal based on the third digital signal, and
the oscillation frequency of the oscillator signal is changed based on the frequency control signal.

17. The oscillator according to claim 2, further comprising:
a digital operation circuit that is configured to generate a frequency control signal,
wherein the digital input circuit has a CMOS inverter circuit, the level shift circuit is located at an upstream side of the CMOS inverter circuit in the digital input circuit with respect to a signal flow direction of the second digital signal, the CMOS inverter circuit is configured to convert the third and fourth voltage values of the second digital signal to fifth and sixth voltage values of a third digital signal, respectively, and the fifth voltage value is higher than the sixth voltage value,
wherein the digital operation circuit is configured to receive the third digital signal, and the digital operation circuit is configured to generate the frequency control signal based on the third digital signal, and
the oscillation frequency of the oscillator signal is changed based on the frequency control signal.

18. The oscillator according to claim 3, further comprising:
a digital operation circuit that is configured to generate a frequency control signal,
wherein the digital input circuit has a CMOS inverter circuit, the level shift circuit is located at an upstream side of the CMOS inverter circuit in the digital input circuit with respect to a signal flow direction of the second digital signal, the CMOS inverter circuit is configured to convert the third and fourth voltage values of the second digital signal to fifth and sixth voltage values of a third digital signal, respectively, and the fifth voltage value is higher than the sixth voltage value,
wherein the digital operation circuit is configured to receive the third digital signal, and the digital operation circuit is configured to generate the frequency control signal based on the third digital signal, and
the oscillation frequency of the oscillator signal is changed based on the frequency control signal.

19. The oscillator according to claim 13, further comprising:
a digital operation circuit that is configured to generate a frequency control signal,
wherein the digital input circuit has a CMOS inverter circuit, the level shift circuit is located at an upstream side of the CMOS inverter circuit in the digital input circuit with respect to a signal flow direction of the second digital signal, the CMOS inverter circuit is configured to convert the third and fourth voltage values of the second digital signal to fifth and sixth voltage values of a third digital signal, respectively, and the fifth voltage value is higher than the sixth voltage value,
wherein the digital operation circuit is configured to receive the third digital signal, and the digital operation circuit is configured to generate the frequency control signal based on the third digital signal, and
the oscillation frequency of the oscillator signal is changed based on the frequency control signal.

20. The oscillator according to claim 14, further comprising:
a digital operation circuit that is configured to generate a frequency control signal,
wherein the digital input circuit has a CMOS inverter circuit, the level shift circuit is located at an upstream side of the CMOS inverter circuit in the digital input circuit with respect to a signal flow direction of the second digital signal, the CMOS inverter circuit is configured to convert the third and fourth voltage values of the second digital signal to fifth and sixth voltage values of a third digital signal, respectively, and the fifth voltage value is higher than the sixth voltage value,
wherein the digital operation circuit is configured to receive the third digital signal, and the digital operation circuit is configured to generate the frequency control signal based on the third digital signal, and
the oscillation frequency of the oscillator signal is changed based on the frequency control signal.

\* \* \* \* \*